US011255674B2

(12) United States Patent
Eitel et al.

(10) Patent No.: US 11,255,674 B2
(45) Date of Patent: Feb. 22, 2022

(54) POSITION DETERMINATION DEVICE AND METHOD

(71) Applicant: Sony Semiconductor Solutions Corporation, Atsugi (JP)

(72) Inventors: Ben Eitel, Stuttgart (DE); Daniel Schneider, Stuttgart (DE); Mark Veltman, Stuttgart (DE)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 722 days.

(21) Appl. No.: 16/019,614

(22) Filed: Jun. 27, 2018

(65) Prior Publication Data
US 2019/0113346 A1 Apr. 18, 2019

(30) Foreign Application Priority Data
Jun. 29, 2017 (EP) .................................. 17178682

(51) Int. Cl.
*G01C 21/08* (2006.01)
*G01S 1/02* (2010.01)
*G01S 5/02* (2010.01)
*G01V 3/40* (2006.01)
*G01R 33/00* (2006.01)
*G01R 33/02* (2006.01)
(Continued)

(52) U.S. Cl.
CPC ............ *G01C 21/08* (2013.01); *G01C 21/206* (2013.01); *G01R 33/00* (2013.01); *G01R 33/02* (2013.01); *G01R 33/10* (2013.01); *G01S 1/02* (2013.01); *G01S 5/0252* (2013.01); *G01V 3/40* (2013.01)

(58) Field of Classification Search
CPC ...... G01C 21/08; G01C 21/206; G01R 33/00; G01R 33/02; G01R 33/10; G01S 1/02; G01S 5/0252; G01V 3/40
See application file for complete search history.

(56) References Cited

U.S. PATENT DOCUMENTS

| 4,654,579 A * | 3/1987 | Masaki ............... H02M 5/2573 |
| | | 323/242 |
| 5,453,686 A | 9/1995 | Anderson |
(Continued)

OTHER PUBLICATIONS

Arie Sheinker et al. "A Method for Indoor Navigation Based on Magnetic Beacons Using Smartphones and Tablets", Measurement, vol. 81, Mar. 2016, abstract only, 3 pages.
(Continued)

*Primary Examiner* — Kyle R Quigley
(74) *Attorney, Agent, or Firm* — Xsensus LLP

(57) ABSTRACT

A position determination device comprises data input circuitry configured to obtain magnetic field sensor data sensed by a magnetic field sensor, separation circuitry configured to separate the obtained magnetic sensor data into low frequency sensor data including frequencies below a frequency threshold and high frequency sensor data including frequencies above the frequency threshold, fingerprint combining circuitry configured to determine a combined magnetic fingerprint based on the low frequency sensor data and the high frequency sensor data, and position determination circuitry configured to determine the sensor position of the magnetic field sensor by comparing the combined magnetic fingerprint with a magnetic map.

20 Claims, 6 Drawing Sheets

(51) Int. Cl.
*G01R 33/10* (2006.01)
*G01C 21/20* (2006.01)

(56) References Cited

U.S. PATENT DOCUMENTS

| | | |
|---|---|---|
| 6,549,004 B1 | 4/2003 | Prigge |
| 2008/0036652 A1 | 2/2008 | Shore et al. |
| 2014/0155098 A1* | 6/2014 | Markham ............ H04B 1/0064 455/456.3 |
| 2014/0191897 A1 | 7/2014 | Perkins et al. |
| 2014/0239943 A1* | 8/2014 | Sheinker ................ G01R 33/02 324/207.17 |
| 2015/0204649 A1 | 7/2015 | McFarthing et al. |
| 2016/0245638 A1* | 8/2016 | Sheinker .............. G01C 21/005 |

OTHER PUBLICATIONS

Eric Prigge "An Indoor Absolute Positioning System with No Line of Sight Restrictions and Building-Wide Coverage", Proceedings of the 2000 IEEE International Conference on Robotics & Automation, Apr. 2000, pp. 1015-1022.

* cited by examiner

POSITION DETERMINATION DEVICE AND METHOD

BACKGROUND

Field of the Disclosure

The present disclosure relates to a position determination device and a corresponding position determination method for determining the position of the device, in particular indoors. The present disclosure relates further to a mobile device, a position determination system and a non-transitory computer-readable recording medium.

Description of Related Art

For indoor positioning (in particular localization and/or navigation) many technologies are being researched. The geomagnetic fingerprinting technology takes advantage of the fact that the magnetic field inside buildings is distorted by the building's construction (material) in a unique way. The idea is to collect magnetic maps of the building (offline phase), which can be used later for positioning/localization (online phase), in a way that current magnetic measurements are matched against the mapped magnetic profile (magnetic fingerprints). The more components a fingerprint contains, the more unique is its evaluation; on the other hand, the less components a fingerprint has, the more matches will be found in a fingerprint map. Of course, a magnetic map of a building may contain many duplicates or at least similar entries.

The Earth's magnetic field can be represented by a 3-dimensional vector (i.e. has x, y, z components), which principally allows generating 3-dimensional fingerprints. However, as the measurements depend on the sensor orientation of the magnetic sensor, which often cannot, or only partly, be detected (e.g. by means of an acceleration sensor), only one magnetic component (e.g. magnitude) or two components (e.g. vertical and horizontal component) may be usable in practice as fingerprint.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a position determination device which further increases the accuracy of the position determination. It is a further object to provide a corresponding method, a mobile device and a position determination system as well as a corresponding computer program for implementing said method and a non-transitory computer-readable recording medium for implementing said method.

According to an aspect there is provided a position determination device comprising:
  data input circuitry configured to obtain magnetic field sensor data sensed by a magnetic field sensor,
  separation circuitry configured to separate the obtained magnetic sensor data into low frequency sensor data including frequencies below a frequency threshold and high frequency sensor data including frequencies above the frequency threshold,
  fingerprint combining circuitry configured to determine a combined magnetic fingerprint based on the low frequency sensor data and the high frequency sensor data, and
  position determination circuitry configured to determine the sensor position of the magnetic field sensor by comparing the combined magnetic fingerprint with a magnetic map.

According to a further aspect there is provided a mobile device comprising:
  a magnetic field sensor for sensing magnetic field sensor data at the position of the mobile device, and
  a position determination device as disclosed herein for determining the position of the mobile device based on the sensed magnetic field sensor data.

According to a further aspect there is provided a position determination system comprising:
  a plurality of beacons configured to generate time-varying magnetic fields in a frequency range above a frequency threshold and arranged at different locations, and
  a position determination device as disclosed herein or a mobile device as disclosed herein for determining the position of the magnetic field sensor.

According to still further aspects a computer program comprising program means for causing a computer to carry out the steps of the method disclosed herein, when said computer program is carried out on a computer, as well as a non-transitory computer-readable recording medium that stores therein a computer program product, which, when executed by a processor, causes the method disclosed herein to be performed are provided.

Embodiments are defined in the dependent claims. It shall be understood that the disclosed method, the disclosed mobile device, the disclosed position determination system, the disclosed computer program and the disclosed computer-readable recording medium have similar and/or identical further embodiments as the claimed position determination device and as defined in the dependent claims and/or disclosed herein.

One of the aspects of the disclosure is to create an artificial time-varying magnetic field (e.g. in the vicinity of points of interest) which can be captured together with the geomagnetic field with the same magnetic sensor, but which can be separated in the frequency domain from the geomagnetic field, i.e. which has one or more frequencies that is/are generally comparably low, but higher than the frequency of the geomagnetic field which is generally constant but may be slowly changing due to movement of the magnetic sensor, e.g. when carried by a moving user. The artificial magnetic field notably increases the size of the feature vector for magnetic fingerprinting which in turn drastically reduces the ambiguity in the derived position estimate and thus increases the accuracy of the position determination.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWING

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
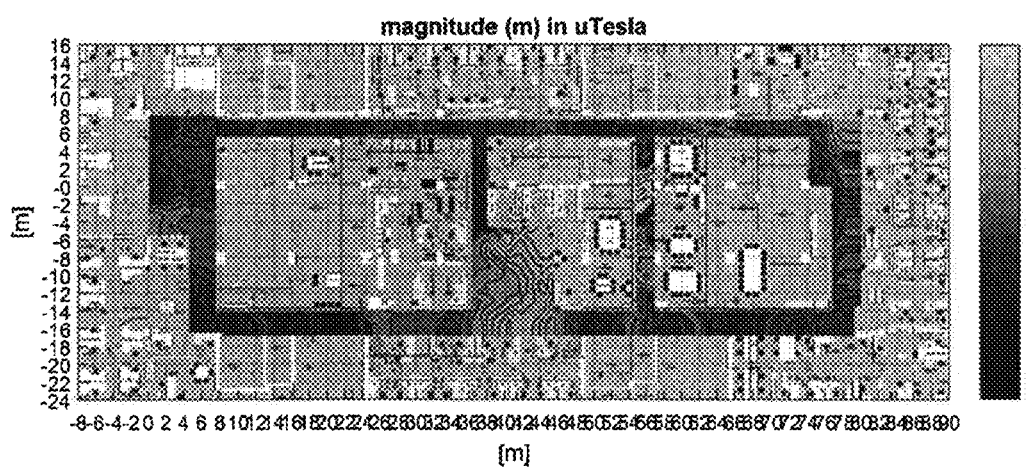
FIG. 1 shows examples of recorded magnitude, inclination and azimuth maps of the geomagnetic field in a building
Figure 1:
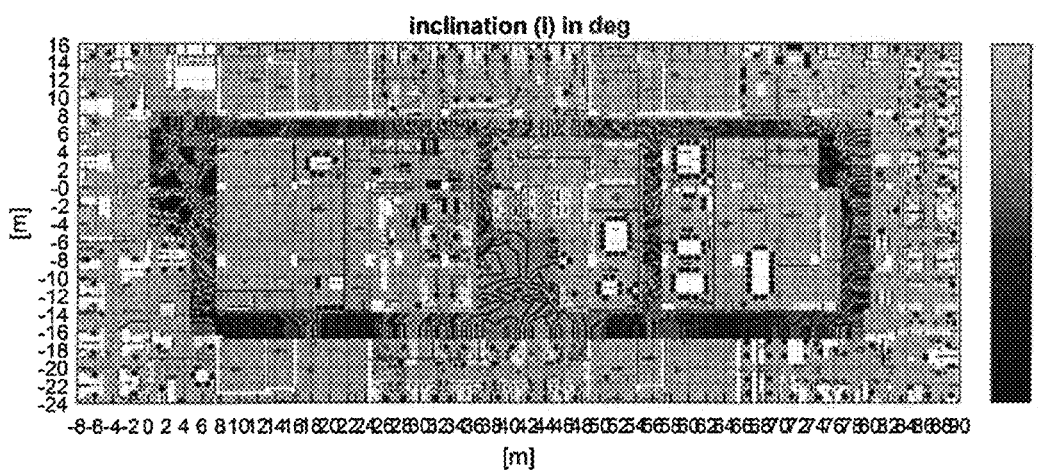
Figure 1:
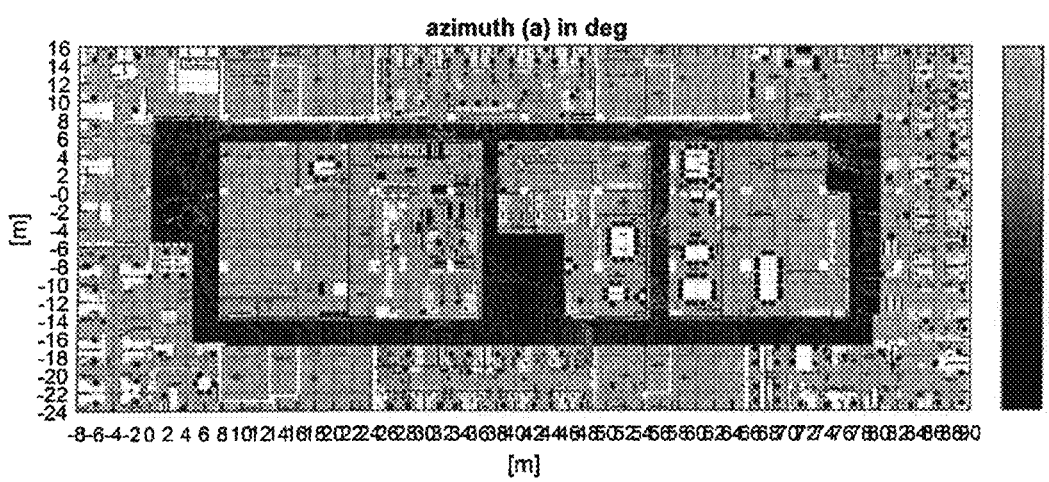

Referring now to the drawings, wherein like reference numerals designate identical or corresponding parts throughout the several views, FIG. 1 shows exemplarily the recorded magnitude, inclination and azimuth of the static geomagnetic field in a building.

The magnitude of the geomagnetic field (sometimes also referred to as magnetic field vector) is simple to derive from a magnetic field measurement, e.g. by a magnetic field sensor, which process does generally not include any additional estimation process. Therefore, it is the most reliable information for geomagnetic fingerprinting. Unfortunately, similar magnitude values can often be found at different locations of the building, i.e. a geomagnetic field measurement can be assigned to several locations in the building with similar likelihood if only magnitude is considered and a corresponding one-dimensional feature vector is used.

The inclination of the geomagnetic field can be computed based on the magnetic field measurement and the direction of the earth's gravity field, which may be measured by an accelerometer. Aside from gravity, the accelerometer can also measure all other accelerations of the mobile/wearable device. Separation of the different acceleration sources is difficult and introduces errors to the estimation of the gravity direction. This in turn degrades the estimation accuracy of the geomagnetic field inclination. Nonetheless, this information can be used together with the magnitude of the geomagnetic field to obtain a two-dimensional feature vector for geomagnetic fingerprinting. Using the two-dimensional feature vector (fingerprint) reduces the amount of position ambiguities, as magnitude and inclination of the magnetic field are widely uncorrelated.

The azimuth information is most difficult to obtain as input for geomagnetic fingerprinting. In addition to the gravity direction an estimate of the mobile/wearable device heading is needed, which is prone to estimation errors, especially due to the inherent drift of gyroscope sensor signal information. Consequently, the use of azimuth information for geomagnetic fingerprinting is typically limited to specific applications, e.g. for localization of robots. The sensors are typically fixed to the body of the robot which simplifies the estimation process and hence reduces the amount of estimation errors. Often, the z-coordinate is already aligned to the gravity direction, sensor heading and motion heading have a fixed relation, so that there is no need for step and step length estimation, etc.

A comparison made in terms of localization accuracy if the feature vector used for geomagnetic fingerprinting contains two or three components of the geomagnetic field shows that the localization accuracy notably drops with a smaller size of the feature vector.

Figure 2:
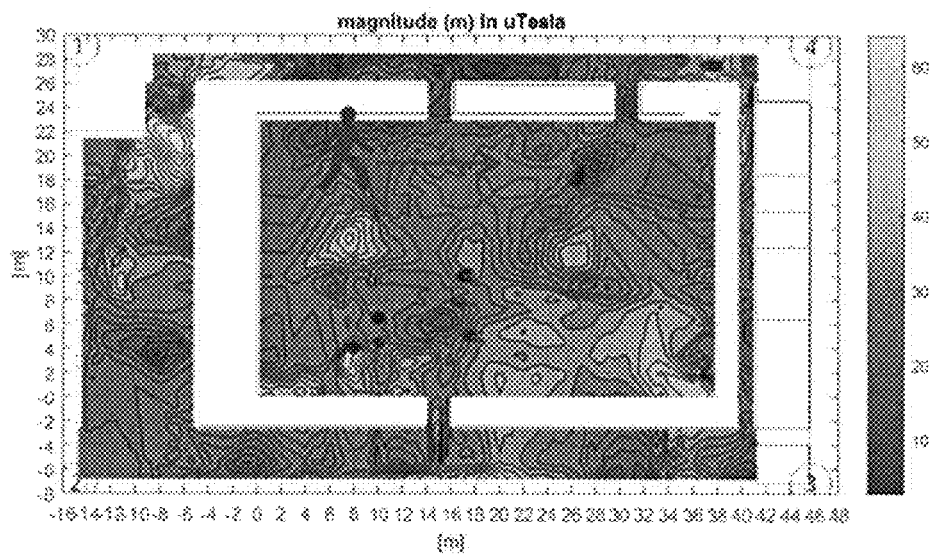
FIG. 2 shows a magnitude map and a spectrum diagram of the captured magnetic field magnitude obtained in an office building at normal walking speed
Figure 2:
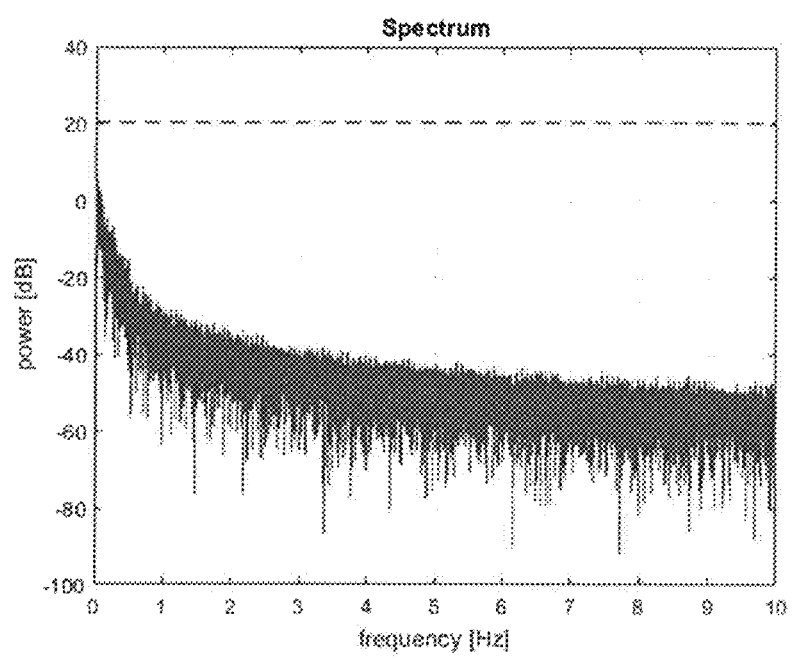

For geomagnetic fingerprinting it is generally assumed that the geomagnetic field is constant. Thus, measuring the magnetic field at a fixed position results in a strong DC component whereas higher frequency components only contain sensor noise. If the position of the magnetic field sensor changes (e.g. because a user carrying a smartphone including the magnetic field sensor moves), the measured magnetic field changes over time and the spectrum of the measured magnetic field gets broader. Field tests have shown that even for fast walking pedestrians the relevant spectral components remain within a (single-sided) bandwidth smaller than e.g. 3 Hz since magnetic fingerprinting is mainly used for indoor localization, where speeds of movement in the range of a walking pedestrian are relevant. Also most means of transportation used indoors, such as carts, conveyance belts, escalators, etc. generally have a small speed of movement. On the other hand, the magnetic sensors available in today's smartphones achieve sampling rates of several 10 Hz, e.g. 50 Hz. FIG. 2 shows an example of the spectrum of a magnetic field signal captured by a mobile device's magnetic field sensor while the user is walking in an office building. In this example, the spectral components are even well below 1 Hz, indicating a relatively slow walking speed.

Consequently, there exists a frequency range of at least 10-20 Hz that can be used to capture artificial magnetic fields together with the geomagnetic field with the same magnetic field sensor (in particular a magnetic field sensor as e. g. normally used in today's smartphones) at the same time. Such artificial magnetic fields may be generated, for example, by magnetic beacons, each beacon generating an artificial magnetic field with a suitable bandwidth (e.g. in the range between 10 and 20 Hz, so that there is no overlap with the frequency band of the geomagnetic field). In one embodiment, the frequency bands of individual artificial magnetic fields (especially of artificial magnetic fields present at one or more same position) differ from each other, e.g. so that there is no overlap. This makes the artificial magnetic fields more distinctive and allows separating the artificial magnetic fields from each other. Preferably, the beacons are placed at selected locations such that at least one artificial magnetic field is available in areas or at positions of particular interest, but not necessarily at all positions within an area/building etc.

Before details of the present disclosure will be described, some definitions shall be given. The term "magnetic map" refers to either the magnetic map (comprising magnetic fingerprints) of a whole area, preferably indoors such as a building, or a sub-part of the magnetic map of the whole area, e.g. a sub-part of the building, such as a floor or a wing of the building. A magnetic map for use in the embodiments disclosed herein, or a suitable subpart of the magnetic map, respectively, comprises magnetic fingerprints of a region around the magnetic field sensor. It can be selected based on a current position of the magnetic field sensor, for example a given location estimate and, optionally, its assumed confidence (e.g. estimated position accuracy), or by a user downloading a suitable magnetic map from a server, etc.

Figure 3:
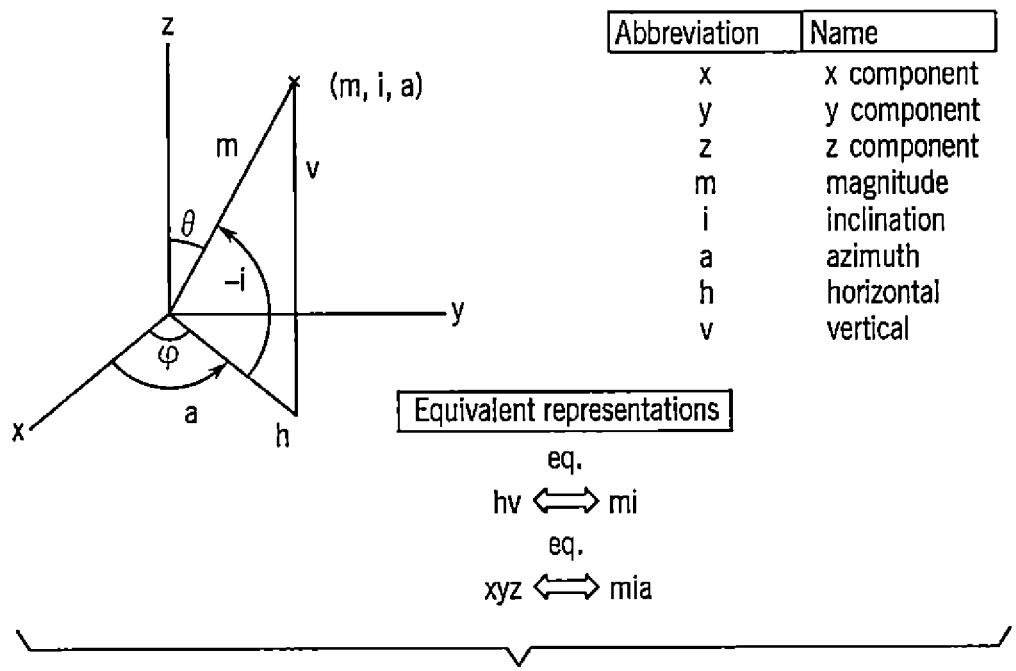
FIG. 3 shows a diagram illustrating coordinate definitions of a magnetic field vector.

Magnetic field measuring data may, for example, be magnetic flow densities in x, y, and z directions of the sensor's local coordinate system for a 3D sensor. An illustration of different representations of the magnetic field vector is shown in FIG. 3 illustrating coordinate definitions of a magnetic field vector. Example features of the magnetic field vector are magnetic field magnitude m, magnetic field inclination i, magnetic field azimuth a, magnetic field vertical component v, magnetic field horizontal component h, magnetic field Cartesian components (x, y, z) and their combinations. For example, the magnetic field vector may be represented by the feature magnetic field horizontal component h and magnetic field vertical component v. Alternatively, a representation by the feature magnetic field magnitude m and magnetic field inclination i can be used. For some situations, a further alternative representation by the magnetic field magnitude m, the magnetic field inclination i and the magnetic field azimuth a may be chosen, or a representation by the Cartesian components x, y and z.

Figure 4:
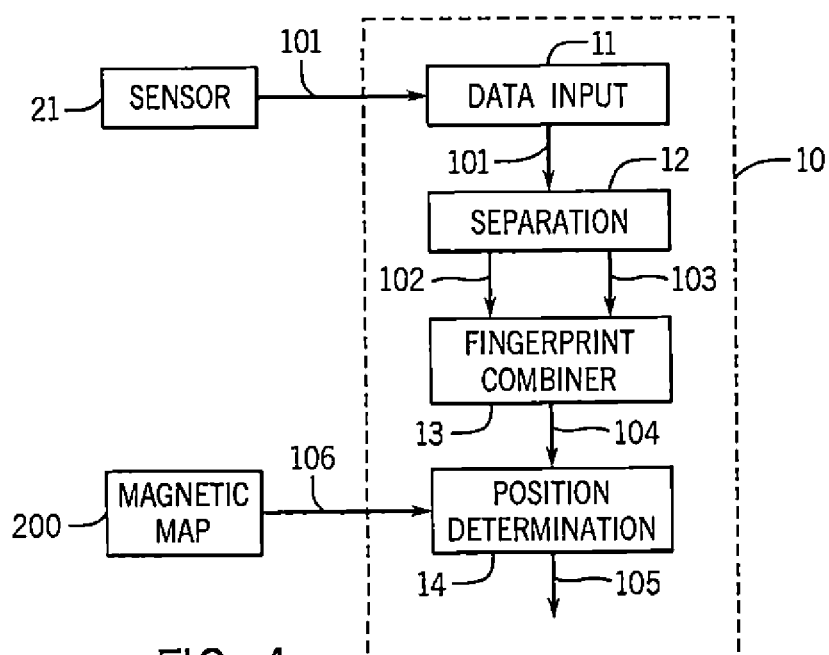
FIG. 4 shows a schematic diagram of a first embodiment of a position determination device according to the present disclosure.

FIG. 4 shows a schematic diagram of a first embodiment of a position determination device 10 according to the present disclosure. The position determination device 10 comprises a data input circuitry 11 configured to obtain magnetic field sensor data 101 sensed by a magnetic field sensor 21 (in this embodiment not being part of the device 10). The data input circuitry 11 may be represented by a data interface, e.g. an interface (such as a HDMI, USB, network interface, etc.) for data reception or retrieval, to receive or retrieve the magnetic field sensor data 101 directly from the magnetic field sensor 21 or from an storage means (e.g. a data carrier, an electronic memory, a buffer, etc.; not shown) where the magnetic field sensor data 101 are stored or buffered.

The position determination device 10 further comprises a separation circuitry 12 configured to separate the obtained magnetic sensor data 101 into low frequency sensor data 102 including frequencies below a frequency threshold (which is the sensor data representing the geomagnetic field) and high frequency sensor data 103 including frequencies above the frequency threshold (which is the sensor data representing the artificial magnetic field(s)). The separation circuitry may be implemented in different ways, e.g. using analog or digital filter elements. The frequency threshold is preferably predetermined and fixed, but may in other embodiments be set and/or changed by a user. In one embodiment, the threshold may be dynamically adapted, e. g. based on current information about the motion of the magnetic field sensor. Embodiments of the separation circuitry and the frequency threshold will be explained below. The frequency threshold may also be understood as a cut-off frequency. In other embodiments the low frequency sensor data 102 and the high frequency sensor data 103 may be defined by a frequency band and/or bandwidth, which do preferably not overlap.

The position determination device 10 further comprises a fingerprint combining circuitry 13 configured to determine a combined magnetic fingerprint based on the low frequency sensor data and the high frequency sensor data. For instance, in an embodiment, a low frequency magnetic fingerprint (which may also be referred to as "static magnetic fingerprint" or "quasi-static magnetic fingerprint" to describe the approximately time-invariant geomagnetic field) may be determined from the low frequency sensor data 102, and a high frequency magnetic fingerprint may be determined from the high frequency sensor data 103, and the low frequency magnetic fingerprint and the high frequency magnetic fingerprint may be combined to obtain the combined magnetic fingerprint 104.

The position determination device 10 further comprises a position determination circuitry 14 configured to determine the sensor position 105 of the magnetic field sensor 21 by comparing the combined magnetic fingerprint 104 with a magnetic map 106. The magnetic map 106 is generally acquired in advance and e.g. provided by a service provider, the owner or operator of a building in which the position determination shall be used, etc., and may be stored in a storage means (not shown; in this embodiment not being part of the device 10) or provided by a server 200 (generally not being part of the device 10), e.g. via the internet or another network. For example, a user may download a magnetic map of a location he wants to visit, or a suitable magnetic map may be downloaded or provided automatically based on current position information of (a device comprising or connected to) the magnetic field sensor 21 (like GPS information obtained before entering a building, or upon detection of a Bluetooth beacon placed at an entry of a building etc.)

The separation circuitry 12 and/or the fingerprint combining circuitry 13 and/or the position determination circuitry 14 may be implemented in (common or separate) hard- and/or software, e.g. an appropriately programmed processor or computer.

In an embodiment said separation circuitry 12 is configured to separate the obtained magnetic sensor data 101 into DC sensor data as low frequency sensor data 102 including the DC component of the magnetic sensor data and AC sensor data as high frequency sensor data 103 including AC components of the magnetic sensor data. In another embodiment said separation circuitry 12 is configured to use as frequency threshold a frequency in the range of 0.1 to 10 Hz, in particular in the range of 1 to 5 Hz.

It should be noted that the bandwidth of each frequency component (which at receiver side actually depends on the speed of motion of the device) may be adapted accordingly to ensure that the frequency components are separated in frequency such that they can be well enough separated from each other. The geomagnetic field is quasi-constant. Measuring the geomagnetic field at a fixed location results in measured signal with a bandwidth of ~0 Hz. But as soon as the sensor changes its position during the measurement, the signal observed is not constant anymore. In fact, the bandwidth of the observed signal increases with the speed of the sensor motion. The same actually happens to the transmitted beacon signal (e.g. a sine wave with 10 Hz) when received by a moving sensor. The beacon signal observed by the moving sensor has an increased bandwidth (or at least a shifted center frequency). Consequently, the beacon frequencies and receiving filters are preferably designed depending on the application (e.g. indoor human localization assuming a certain maximum walking speed).

In another embodiment the separation circuitry 12 is configured to separate the high frequency sensor data into two or more high frequency sensor data portions, and the fingerprint combining circuitry 13 is configured to determine two or more high frequency magnetic fingerprint portions from the two or more high frequency sensor data portions and to combine the low frequency magnetic fingerprint and the two or more high frequency magnetic fingerprint portions to obtain the combined magnetic fingerprint. Hereby, the separation circuitry may be configured to separate the high frequency sensor data into two or more high frequency sensor data portions by use of a frequency shift of the respective sensor data portions, e.g. into the baseband to apply a common low-pass filter and separate the low-frequency frequency component from the other frequency components in the baseband. In an embodiment, a phase-correct carrier demodulation from the center frequency onto the frequency of 0 Hz may be applied. Then, the combined magnetic fingerprint is generated in the baseband.

In the context of the present disclosure the magnetic map may comprise more dimensions, i.e. more components (in particular separate components for low frequency sensor data and high frequency sensor data) than a conventional magnetic map (generally comprising magnitude, inclination and azimuth of the magnetic field). In this case, those (additional) components may be used alone or in addition to the generally available components for magnetic fingerprinting (and for position determination). The presented approach is thus backwards compatible, even if the magnetic map comprises more dimensions than the measured fingerprint vector. For this purpose, the magnetic map preferably comprises all components (i.e. the generally known components and the additional components), e.g. in the form of a multiplexed magnetic fingerprint vector. From this multiplexed magnetic fingerprint vector each desired format of a magnetic fingerprint vector can be derived and used for comparison with a fingerprint vector derived from the measured data.

Figure 5:
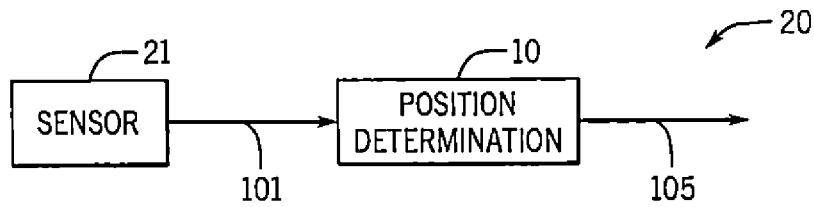
FIG. 5 shows a schematic diagram of a first embodiment of a mobile device according to the present disclosure.

FIG. 5 shows a schematic diagram of a first embodiment of a mobile device 20 according to the present disclosure. The mobile device 20 may e.g. be a handheld device, a wearable device, a mobile phone, a smartphone, a portable phone, a camera, a smart watch, a vital signs monitor, a laptop, a tablet, smart glasses, or any other portable device that may be carried around by a user. The mobile device 20 comprises a magnetic field sensor 21 (e.g. as shown in FIG. 4) for sensing magnetic field sensor data 101 at the position of the mobile device and a position determination device 10 (e.g. as shown in FIG. 4) as disclosed herein for determining the position of the magnetic field sensor 21 and the mobile device 20, respectively, based on the sensed magnetic field sensor data 101.

Figure 6:
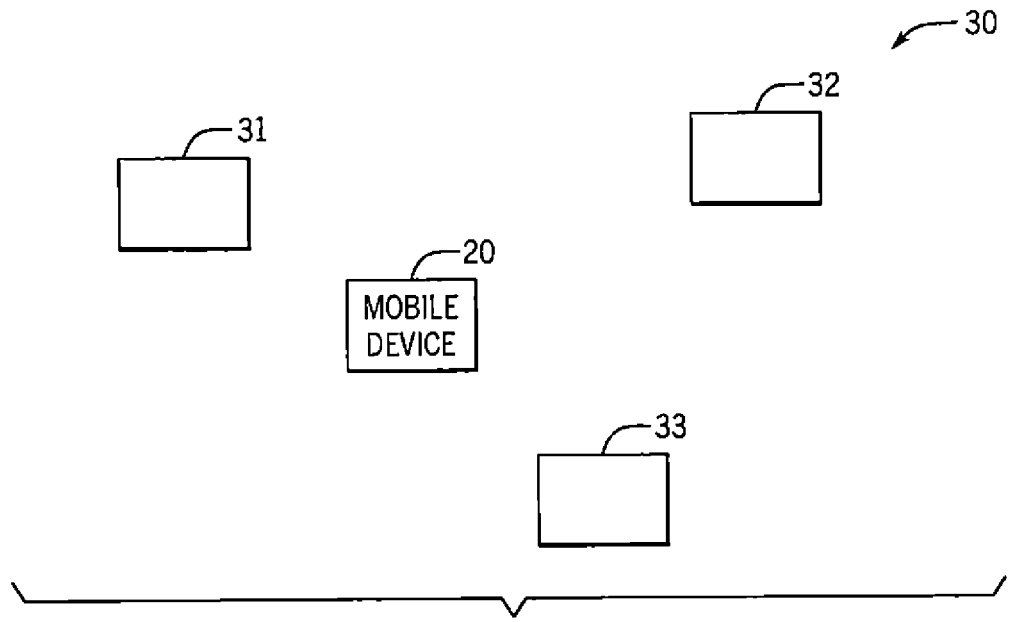
FIG. 6 shows a schematic diagram of an embodiment of a position determination system according to the present disclosure.

FIG. 6 shows a schematic diagram of a position determination system 30 according to the present disclosure. The position determination system 30 comprises a plurality of beacons 31, 32, 33 configured to generate time-varying magnetic fields in a frequency range above a frequency threshold and arranged at different locations. Said beacons 31, 32, 33 may be any elements, e.g. coils or inductive loops, that generate a time-varying (dynamic) magnetic field having a frequency above the above-mentioned frequency threshold, e.g. above 3 Hz. The plurality of beacons and their arrangement hence allows determining of the position of the magnetic field sensor 21. The position determination system 30 may thus further comprise a position determination device 10 (e.g. as shown in FIG. 4) and/or a mobile device 20 (e.g. as shown in FIG. 5) as disclosed herein for determining the position of the magnetic field sensor 21.

According to embodiments of the present disclosure magnetic beacons 31, 32, 33 may be deployed in a building (e.g. at specific points of interest) and generate magnetic fields in a frequency range above the frequency threshold, e.g. above 3 Hz, and below half of the (average) sampling rate (e.g. 50 Hz) of the magnetic field sensors typically used in mobile devices. From each additional and separable beacon signal up to three additional feature vector components (e.g. magnitude, inclination and azimuth) can be obtained. This way, the size of the feature vector used for magnetic fingerprinting can be notably increased, ambiguities can be minimized and positioning accuracy can be maximized.

Figure 7:
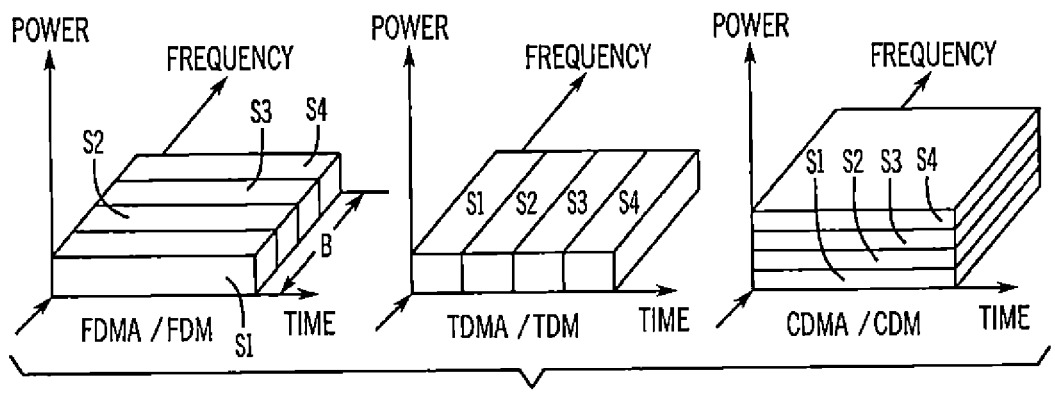
FIG. 7 shows diagrams illustrating several solutions to separate signals from different sources in time.

In the case that two or more magnetic beacons are visible at a particular position by a mobile device, it is made sure in an embodiment on beacon (e.g. planning) side that the beacon information can be separated on mobile device side to maximize the size of the feature vector, e.g. by assigning certain time slots and/or frequencies. In this embodiment, up to three additional feature vector components per visible beacon may be obtained. Possible solutions to separate signals from different sources (e. g. beacons) in time are schematically depicted in FIG. 7 showing signals S1-S4 (indicating beacon (or source) signals), including frequency-division multiple access (FDMA)/frequency-division multiplexing (FDM), time-division multiple access (TDMA)/time-division multiplexing (TDM), and code-division multiple access (CDMA)/code-division multiplexing (CDM). Another option (not shown) is spatial multiplexing.

Figure 8:
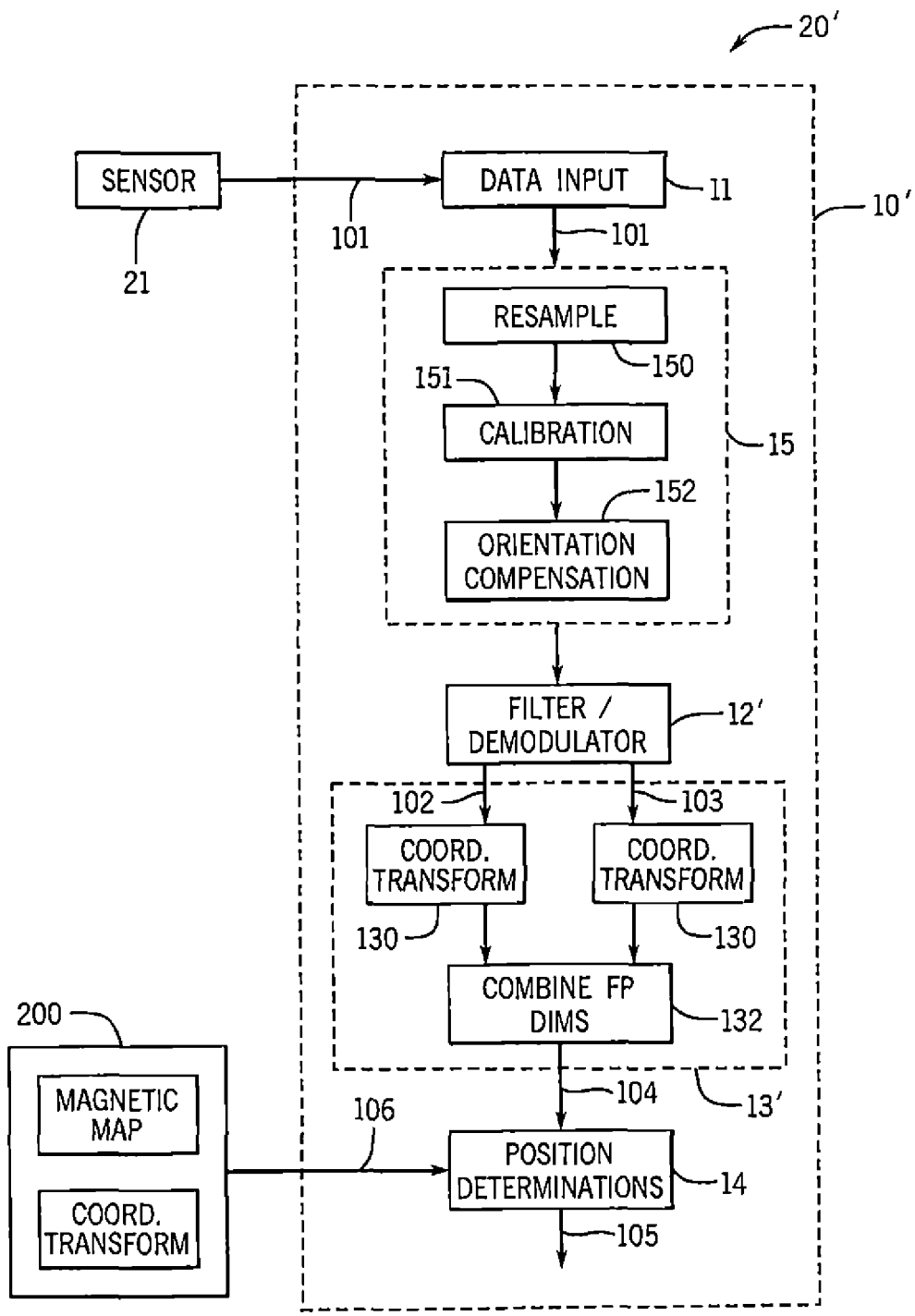
FIG. 8 shows a schematic diagram of a second embodiment of a mobile device including a second embodiment of a position determination device according to the present disclosure.

FIG. 8 shows a schematic diagram of a second embodiment of a mobile device 20' including a second embodiment of a position determination device 10' according to the present disclosure. It also shows a storage unit 200, e.g. a server, on which the magnetic map 201 is stored, which may be subject to coordination transformation in a transformation unit 202 before being used by the position determination circuitry 14.

Compared to the first embodiment of the position determination device 10, the position determination device 10' comprises a preprocessing circuitry 15 for preprocessing the obtained magnetic field sensor data 101. The preprocessing circuitry 15 comprises one or more of a resampling circuitry 150 for resampling the obtained magnetic field sensor data 101, a calibration circuitry 151 for calibrating the resampled magnetic field sensor data 101 and an orientation compensation circuitry 152 for correcting the orientation to align the orientation for comparison to the orientation of the fingerprints stored in the magnetic map.

The separation circuitry in this embodiment is implemented as filter and/or demodulation and/or demultiplexing circuitry 12' to separate the multiplexed magnetic fingerprints according to one of the modes described above, i.e. to obtain low frequency sensor data 102 and high frequency sensor data 103. For instance, in case of FDMA it may comprise a mixer to shift each frequency component (e.g. generated by a magnetic beacon) to the baseband and a subsequent filter separating the baseband signal from the other frequency components. For separating the geomagnetic field from other frequency components the mixer frequency would be equal to zero.

It should be noted that the sequence of one or more blocks of the position determination device may change depending on the implementation, e.g. the sensor preprocessing circuitry may be located after the filter and/or demodulation and/or demultiplexing circuitry 12' for each individual path.

The fingerprint combining circuitry 13' in this embodiment may, in each path, comprise a coordinate transformation circuitry 130, 131, e.g. for converting from Cartesian coordinates (xyz) to magnitude and inclination. Further, a combining circuitry 132 is provided for combining (e.g. multiplexing) the different fingerprints (FPs) to form the multi-dimensional fingerprint 104, which is then compared in the position determination circuitry 14 to the (multi-dimensional) magnetic fingerprints stored in the magnetic map 106 to determine the sensor position of the magnetic field sensor 21 and thus of the mobile device 20'.

The multi-dimensional fingerprint 104 depends on the implementation of the combining (e.g. multiplexing) mode and the coordinate transformations. An example may be: [m$_e$ i$_e$ a$_e$ m$_{f1}$ i$_{f1}$ a$_{f1}$]. In this example the magnitude m/inclination i and azimuth a of the earth magnetic field (indicated by subscript "e") and one magnetic beacon operating at frequency f$_1$ are used to form the combined (e.g. multiplexed) fingerprint vector. In another example only the magnitude m and inclination i of the magnetic field are used and two magnetic beacons are deployed. The combined fingerprint vector may be formed like this in this case: [m$_e$ i$_e$ m$_{f1}$ i$_{f1}$ m$_{f2}$ i$_{f2}$]. It is also possible to use different fingerprint dimensions of the combined paths, e.g. [m$_e$ i$_e$ m$_{f1}$ m$_{f2}$ i$_{f2}$ a$_{f2}$], or to use difference signals as fingerprint vector, e.g. [m$_e$–m$_{f1}$ i$_e$–i$_{f2}$ a$_e$–a$_{f2}$].

In the previous embodiment, the combining circuitry 132 simply combines (e.g. multiplexes) the magnetic fingerprints of the various paths. In another embodiment the combining circuitry 132 may additionally include a weighting factor of the individual fingerprint dimensions (i.e. the number of components of the fingerprint vector). If the reliability of a particular fingerprint component is low, this may be indicated by a low weight for this fingerprint component. For instance, if the distance to a certain magnetic beacon is high, the artificial magnetic field of this beacon is attenuated (compared to the earth magnetic field or the artificial magnetic field of other magnetic beacons) and therefore less reliable. In this case, a low weight may be assigned to all components of the combined fingerprint which are obtained based on the beacon's artificial magnetic field (that is, based on the high frequency sensor data or the high frequency sensor data portion corresponding to the beacon, respectively). In another embodiment some fingerprint dimensions might be rejected overall (i.e. by setting the weight to 0). The rejection criterion may be realized by predefined thresholds.

In another exemplary embodiment the magnitude of the magnetic field can be directly obtained from its x, y, and z component. Therefore it is quite reliable information. The inclination of the magnetic field is more difficult to obtain and requires additional (noisy) sensor input (accelerometer, gyroscope). The estimation errors reduce the reliability of the inclination estimate compared to the magnitude estimate. In still another exemplary embodiment beacon signals received at high magnetic field intensity are typically more reliable compared to beacon signals received at low magnetic field intensity.

In case of densely deployed beacons and/or limitations in available frequency bandwidth, the non-separable beacon signals may additionally be phase-aligned with constant phase offset in another embodiment. Due to its availability in the building, it is proposed in this embodiment to use e.g. the AC signal of the low voltage system (e.g. 230V, 50 Hz in Germany) as reference frequency and phase information to derive the carrier frequencies (e.g. integer dividers) for the magnetic beacons. Nonetheless, also dedicated reference signals might be used for synchronization, such as.

Magnetic beacons 31, 32, 33 as used herein may be made up of coils which possess geometric symmetries. The resulting artificial magnetic field then also possesses such symmetries (neglecting distortions caused by the building structure). Such symmetries might reduce the diversity of the artificial magnetic field caused by multiple beacons. Therefore, in an embodiment the orientation of the magnetic beacons may be considered in the beacon net planning in addition to typical frequency reuse strategies known from communications systems. Further, in an embodiment assumptions about the statistics of the speed of the mobile devices may be considered in the beacon net planning strategy, in particular at which locations beacons are arranged, and/or which number of beacons is required, and/or which frequencies are used. This way, the available spectrum can be used in an optimal way.

Further, in an embodiment the magnetic field of the beacons may be modulated to transmit information (e.g. beacon position, beacon signal strength, beacon ID, etc.). Such information can e.g. be used to further improve the position estimate of the mobile device. For this, the mobile device needs corresponding demodulation circuitry and an enhanced or additional position determination device.

Besides using a coil or inductive loop dedicated for generating the artificial magnetic field and/or information transmission, respectively, it is also possible to apply this approach to a coil or inductive loop that is used for other purposes. For example, the information can be transmitted with a vehicle detection loop. Another example is transmitting the information signal with an audio induction loop (such as hearing loops). When using the coil or inductive loop for multiple purposes this system can support both modes (i.e. the first mode in which the coil or inductive loop is used for its original purpose and the second mode in which the coil or inductive loop is used for generating the artificial magnetic field and/or information transmission, respectively) either alternatively or simultaneously. Systems that support multiple modes simultaneously can avoid conflicts with one (or a combination of the) separation techniques mentioned above. In case of hearing loops this can be achieved with frequency division multiplex by transmitting the additional information signal on a frequency outside the human's audible frequency range. That is, by sending the additional information at a frequency below 20 Hz or above 20 kHz the system can avoid disturbing the analog audio signal.

The arrangement of the magnetic beacons may change from time to time. For example, magnetic beacons may be added or removed. For example, for a trade fair each booth may have its own beacon, which would mean that the artificial magnetic field would be different for each trade fair. Of course, the magnetic map would have to be newly recorded in the case of changes to the arrangement of the magnetic beacons.

Figure 9:
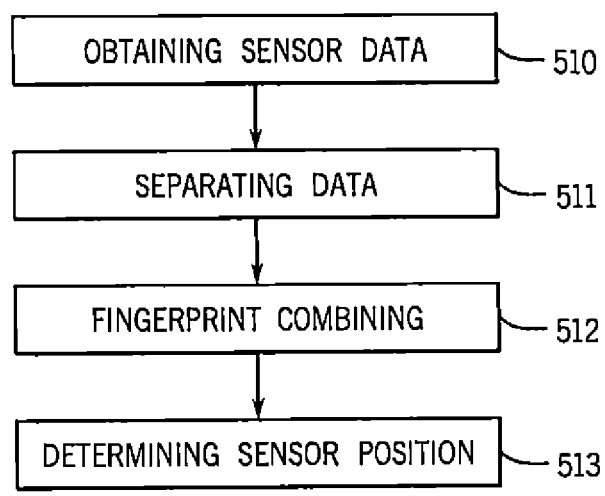
FIG. 9 shows a flowchart of an embodiment of a method according to the present disclosure.

FIG. 9 shows a flowchart of an embodiment of a method 70 according to the present disclosure. In a first step S10 magnetic field sensor data sensed by a magnetic field sensor are obtained (retrieved or received). In a second step S11 the obtained magnetic sensor data are separated into low frequency sensor data including frequencies below a frequency threshold and high frequency sensor data including frequencies above the frequency threshold. In a third step S12 a combined magnetic fingerprint is obtained from the low frequency sensor data and the high frequency sensor data. In a fourth step S13 the sensor position of the magnetic field sensor is determined by comparing the combined magnetic fingerprint with a magnetic map.

In summary, according to the present disclosure the size of the feature vector applicable to magnetic fingerprinting for indoor localization can be increased. This minimizes the issue of ambiguities in the position estimates and thus allows for using magnetic fingerprinting as stand-alone positioning technology (no PDR needed), e.g. for indoor spots. The present disclosure generally requires no additional hardware on the mobile device side.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

The elements of the disclosed devices, apparatus and systems may be implemented by corresponding hardware and/or software elements, for instance appropriated circuits. A circuit is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

It follows a list of further embodiments of the disclosed subject matter:

1. A position determination device comprising:
data input circuitry configured to obtain magnetic field sensor data sensed by a magnetic field sensor,
separation circuitry configured to separate the obtained magnetic sensor data into low frequency sensor data including frequencies below a frequency threshold and high frequency sensor data including frequencies above the frequency threshold,
fingerprint combining circuitry configured to determine a combined magnetic fingerprint based on the low frequency sensor data and the high frequency sensor data, and
position determination circuitry configured to determine the sensor position of the magnetic field sensor by comparing the combined magnetic fingerprint with a magnetic map.

2. The position determination device as defined in any preceding embodiment, wherein said separation circuitry is configured to separate the obtained magnetic sensor data into DC sensor data as low frequency sensor data including the DC component of the magnetic sensor data and AC sensor data as high frequency sensor data including AC components of the magnetic sensor data.

3. The position determination device as defined in any preceding embodiment, wherein said separation circuitry is configured to use as frequency threshold a frequency in the range of 0.1 to 10 Hz or in the range of 1 to 5 Hz.

4. The position determination device as defined in any preceding embodiment, wherein said magnetic combining circuitry is configured to determine a low frequency magnetic fingerprint from the low frequency sensor data and a high frequency magnetic fingerprint from the high frequency sensor data and to combine the low frequency magnetic fingerprint and the high frequency magnetic fingerprint to obtain the combined magnetic fingerprint.

5. The position determination device as defined in embodiment 4, wherein said separation circuitry is configured to separate the high frequency sensor data into two or more high frequency sensor data portions and wherein said fingerprint combining circuitry is configured to determine two or more high frequency magnetic fingerprint portions from the two or more high frequency sensor data portions and to combine the low frequency magnetic fingerprint and the two or more high frequency magnetic fingerprint portions to obtain the combined magnetic fingerprint.

6. The position determination device as defined in embodiment 5, wherein said fingerprint combining circuitry is configured to weigh and/or select two or more high frequency magnetic fingerprint portions from the two or more high frequency sensor data portions based on their signal-to-noise ratio and/or their energy and to combine the low frequency magnetic fingerprint and the weighted or selected two or more high frequency magnetic fingerprint portions to obtain the combined magnetic fingerprint.

7. The position determination device as defined in embodiment 5 or 6, wherein said separation circuitry comprises a demultiplexing circuitry to demultiplex the high frequency sensor data into two or more high frequency sensor data portions according to a predetermined multiplexing scheme.

8. The position determination device as defined in embodiment 5 or 6, wherein said separation circuitry comprises a filter circuitry to filter the high frequency sensor data into two or more high frequency sensor data portions using one or more filter thresholds.

9. The position determination device as defined in any one of embodiments 5 to 8, wherein said separation circuitry is configured to separate the high frequency sensor data into two or more high frequency sensor data portions by use of a frequency shift of the respective sensor data portions.

10. The position determination device as defined in any preceding embodiment, further comprising demodulation circuitry to demodulate information modulated onto the high frequency sensor data.

11. A mobile device comprising:
a magnetic field sensor for sensing magnetic field sensor data at the position of the mobile device, and
a position determination device as defined in embodiment 1 for determining the position of the mobile device based on the sensed magnetic field sensor data.

12. A position determination system comprising:
a plurality of beacons configured to generate time-varying magnetic fields in a frequency range above a frequency threshold and arranged at different locations, and
a mobile device as defined in embodiment 11 for determining the position of the magnetic field sensor.

13. The position determination system as defined in embodiment 12, wherein said beacons are configured to multiplex the time-varying magnetic fields by applying time division multiplex, frequency division multiplex, code division multiplex or spatial multiplex.

14. The position determination system as defined in embodiment 12 or 13, wherein said beacons are configured to synchronize the time-varying magnetic fields in time by use of a reference signal and to apply a (same or different) constant phase shift to the different time-varying magnetic fields.

15. The position determination system as defined in embodiment 14, wherein said beacons are configured to use the frequency of the mains voltage as reference signal.

16. The position determination system as defined in any one of embodiments 12 to 15, wherein said beacons are configured to modulate information onto the time-varying magnetic fields.

17. The position determination system as defined in any one of embodiments 12 to 16, wherein coils of electric devices are used as said beacons.

18. The position determination system as defined any one of embodiments 12 to 17, wherein said beacons are configured as detection coils or audio coils of a loud speaker.

19. A position determination method comprising:
obtaining magnetic field sensor data sensed by a magnetic field sensor,
separating the obtained magnetic sensor data into low frequency sensor data including frequencies below a frequency threshold and high frequency sensor data including frequencies above the frequency threshold,
determining a combined magnetic fingerprint based on the low frequency sensor data and the high frequency sensor data, and
determining the sensor position of the magnetic field sensor by comparing the combined magnetic fingerprint with a magnetic map.

20. A non-transitory computer-readable recording medium that stores therein a computer program product, which, when executed by a processor, causes the method according to embodiment 19 to be performed.

21. A computer program comprising program code means for causing a computer to perform the steps of said method according to embodiment 19 when said computer program is carried out on a computer.

The invention claimed is:

1. A position determination device comprising:
data input circuitry configured to obtain magnetic field sensor data sensed by a magnetic field sensor,
separation circuitry configured to separate the obtained magnetic sensor data into low frequency sensor data including frequencies below a frequency threshold and high frequency sensor data including frequencies above the frequency threshold,
fingerprint combining circuitry configured to determine a low frequency magnetic fingerprint from the low frequency sensor data and a high frequency magnetic fingerprint from the high frequency sensor data and to combine the low frequency magnetic fingerprint and the high frequency magnetic fingerprint to obtain a multi-dimensional magnetic fingerprint, and
position determination circuitry configured to determine the sensor position of the magnetic field sensor by comparing the multi-dimensional magnetic fingerprint with a magnetic map.

2. The position determination device as claimed in claim 1,
wherein said separation circuitry is configured to separate the obtained magnetic sensor data into DC sensor data as low frequency sensor data including the DC component of
the magnetic sensor data and AC sensor data as high frequency sensor data including AC components of the magnetic sensor data.

3. The position determination device as claimed in claim 1,
wherein said separation circuitry is configured to use as frequency threshold a frequency in the range of 0.1 to 10 Hz or in the range of 1 to 5 Hz.

4. The position determination device as claimed in claim 1,
wherein said separation circuitry is configured to separate the high frequency sensor data into two or more high frequency sensor data portions and
wherein said fingerprint combining circuitry is configured to determine two or more high frequency magnetic fingerprint portions from the two or more high frequency sensor data portions and to combine the low frequency magnetic fingerprint and the two or more high frequency magnetic fingerprint portions having different frequencies to obtain the multi-dimensional magnetic fingerprint.

5. The position determination device as claimed in claim 4,
wherein said fingerprint combining circuitry is configured to weigh and/or select two or more high frequency magnetic fingerprint portions from the two or more high frequency sensor data portions based on their signal-to-noise ratio and/or their energy and to combine the low frequency magnetic fingerprint and the weighted or selected two or more high frequency magnetic fingerprint portions to obtain the multi-dimensional magnetic fingerprint.

6. The position determination device as claimed in claim 4,
wherein said separation circuitry comprises a demultiplexing circuitry to demultiplex the high frequency sensor data into two or more high frequency sensor data portions according to a predetermined multiplexing scheme.

7. The position determination device as claimed in claim 4,
wherein said separation circuitry comprises a filter circuitry to filter the high frequency sensor data into two or more high frequency sensor data portions using one or more filter thresholds.

8. The position determination device as claimed in claim 4,
wherein said separation circuitry is configured to separate the high frequency sensor data into two or more high frequency sensor data portions by use of a frequency shift of the respective sensor data portions.

9. The position determination device as claimed in claim 1,
further comprising demodulation circuitry to demodulate information modulated onto the high frequency sensor data.

10. A mobile device comprising:
a magnetic field sensor for sensing magnetic field sensor data at the position of the mobile device, and
a position determination device as claimed in claim 1 for determining the position of the mobile device based on the sensed magnetic field sensor data.

11. A position determination system comprising:
a plurality of beacons configured to generate time-varying magnetic fields in a frequency range above a frequency threshold and arranged at different locations, and
a position determination device as claimed in claim 1 for determining the position of the magnetic field sensor.

12. The position determination system as claimed in claim 11,
wherein said beacons are configured to multiplex the time-varying magnetic fields by applying time division multiplex, frequency division multiplex, code division multiplex or spatial multiplex.

13. The position determination system as claimed in claim 11,
wherein said beacons are configured to synchronize the time-varying magnetic fields in time by use of a reference signal and to apply a constant phase shift to the different time-varying magnetic fields.

14. The position determination system as claimed in claim 13,
wherein said beacons are configured to use a frequency of a mains voltage as a reference signal.

15. The position determination system as claimed in claim 11,
wherein said beacons are configured to modulate information onto the time-varying magnetic fields.

16. The position determination system as claimed in claim 11, wherein coils of electric devices are used as said beacons.

17. The position determination system as claimed in claim 11,
wherein said beacons are configured as detection coils or audio coils of a loud speaker.

18. A position determination method comprising:
obtaining magnetic field sensor data sensed by a magnetic field sensor,
separating the obtained magnetic sensor data into low frequency sensor data including frequencies below a frequency threshold and high frequency sensor data including frequencies above the frequency threshold,
determining a low frequency magnetic fingerprint from the low frequency sensor data,
determining a high frequency magnetic fingerprint from the high frequency sensor data,
combining the low frequency magnetic fingerprint and the high frequency magnetic fingerprint to obtain a multi-dimensional magnetic fingerprint, and
determining the sensor position of the magnetic field sensor by comparing the multi-dimensional magnetic fingerprint with a magnetic map.

19. A non-transitory computer-readable recording medium that stores therein a computer program product, which, when executed by a processor, causes the method according to claim 18 to be performed.

20. The method as claimed in claim 18,
wherein separating includes separating the obtained magnetic sensor data into DC sensor data as low frequency sensor data including the DC component of the magnetic sensor data and AC sensor data as high frequency sensor data including AC components of the magnetic sensor data.

* * * * *